United States Patent [19]
Wong et al.

[11] Patent Number: 5,946,601
[45] Date of Patent: Aug. 31, 1999

[54] UNIQUE α-C:N:H/α-C:$N_x$ FILM LINER/BARRIER TO PREVENT FLUORINE OUTDIFFUSION FROM α-FC CHEMICAL VAPOR DEPOSITION DIELECTRIC LAYERS

[75] Inventors: Lawrence D. Wong, Beaverton, Oreg.; Indrajit Banerjee, San Jose; Steven Towie, Menlo Park, both of Calif.

[73] Assignee: Intel Corporation, Santa Clara, Calif.

[21] Appl. No.: 09/001,547

[22] Filed: Dec. 31, 1997

[51] Int. Cl.$^6$ ........................................ H01L 23/58
[52] U.S. Cl. ........................ 438/783; 148/DIG. 1; 438/623; 438/624
[58] Field of Search ........................ 438/783, 623, 438/624; 148/DIG. 1; 257/632, 760

[56] References Cited

U.S. PATENT DOCUMENTS 5,453,168  9/1995  Nelson et al. .................. 204/192.6
5,661,334  8/1997  Akram .................. 257/760
5,759,906  6/1998  Lou .................. 438/623

*Primary Examiner*—Peter Toby Brown
*Assistant Examiner*—Maria Guerrero
*Attorney, Agent, or Firm*—Blakely, Sokoloff, Taylor & Zafman LLP

[57] ABSTRACT

The present invention is a liner and/or barrier layer that will encapsulate the low k materials and act as a diffusion barrier between the low k material and the surrounding metal layers. As the temperatures of the processing sequence increase the liner and/or barrier layer will decrease the diffusion of fluorine from the low k material into the surrounding metal layers. Thus, the present invention will reduce potential corrosion problems of the metal layers.

12 Claims, 6 Drawing Sheets

UNIQUE α-C:N:H/α-C:N$_x$ FILM LINER/BARRIER TO PREVENT FLUORINE OUTDIFFUSION FROM α-FC CHEMICAL VAPOR DEPOSITION DIELECTRIC LAYERS

BACKGROUND OF THE INVENTION

1. Field of the Invention

The present invention relates to the field of semiconductor devices, and more specifically, to a process for decreasing outdiffusion of fluorocarbons from low k materials.

2. Background Information

Integrated circuits manufactured today are made up of literally millions of active devices such as transistors and capacitors formed in a semiconductor substrate. These active devices are formed and interconnected in an elaborate system of layers. As semiconductor devices become smaller and faster there are certain limiting factors that must be overcome for next generation devices.

One such factor is the RC Time Constant. The RC Time Constant is the fundamental limit of a microprocessor caused by the capacitance between the metal lines of the microprocessor. There are two things which determine the RC Time Constant: the resistance of the metal lines themselves and the capacitance of the dielectric materials. The most commonly used dielectric material is silicon dioxide ($SiO_2$), which has a dielectric constant (k) of approximately k=4. Thus, in order to reduce the RC Time Constant many manufacturers are turning to materials with lower dielectric constants.

One way which has been found to reduce the dielectric constant of oxides, such as silicon dioxide, is to dope the oxide. For example, doping silicon dioxide with fluorine reduces the dipole of silicon dioxide and thereby reduces the dielectric constant. Using fluorine to dope an oxide creates what is called a fluorinated silicate glass (FSG or SiOF). FSG has a dielectric constant of approximately k=3.3–3.7.

Another way to reduce the dielectric constant is to replace the oxide with another low k material altogether, for example low k polymers. Low k polymers have been found to have dielectric constants in the range of approximately k=1.8–3.3. Some examples of low k polymers are polyaromatic ethers (PAEs), aerogels, xerogels, and parylene.

By using low k materials several advantages may be obtained. The use of low k materials have been found reduce the RC Time Constant due to a decreased capacitance. Reducing the RC Time Constant helps to increase the speed of the device. The use of low k materials have also been found to improve power dissipation and to reduce crosstalk noise between metal lines.

Unfortunately, low k materials tend to be made up of fluorocarbons and have a lower thermal stability than previously used oxides. During the process sequence to fabricate transistors and their interconnect structures temperatures in excess of 400° C. are often reached. As the processing temperatures climb and the low k materials heat up, fluorine and other chemical species from the low k materials (due to their lower thermal stability) tend to outdiffuse into the surrounding metal layers. Fluorine outdiffusion is known to cause corrosion in the metal layers and to create potential adhesion problems with juxtaposed dielectric films which can ultimately create yield and reliability problems in the devices being fabricated.

Thus, what is needed is a method to decrease fluorine outdiffusion from low k polymers during higher temperature processing.

SUMMARY OF THE INVENTION

The present invention is a method for decreasing fluorine outdiffusion. A fluorine barrier layer is deposited between a metal layer and a low k material.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A Unique α-C:N:H/α-C:N$_x$ Film Liner/Barrier for α-FC Chemical Vapor Deposition Dielectric Layers for Advanced Interconnects is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention is a liner and/or barrier layer that will encapsulate the low k materials and act as a diffusion barrier between the low k material and the surrounding metal layers. As the temperatures of the processing sequence increase the liner and/or barrier layer will decrease the diffusion of fluorine from the low k material into the surrounding metal layers. Thus, the present invention will reduce potential corrosion problems of the metal layers and/or minimize adhesion problems with juxtaposed dielectric films.

It should be noted that, the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing portions of an integrated circuit during fabrication are not drawn to scale, but instead are drawn so as to illustrate the important features of the invention.

It should also be noted that, the terms wafer and substrate are being used herein interchangeably. Also, that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SIO) devices, or substrates for processing other apparati and devices such as flat panel displays, multichip modules, etc.

As stated in the background of the invention, low k materials, such as polymers, are being used in order to reduce the RC time constant, reduce power dissipation, and reduce metal line cross talk in order to improve the performance of semiconductor devices. Such low k materials however may be thermally unstable at higher temperatures reached during the process sequence to fabricate transistors and their interconnect structures and exhibit fluorine diffusion. Some examples of low k materials are: fluorinated silicate glasses (FSGs), and polymers such as polyaromatic ethers (PAEs), aerogels, xerogels, and parylene.

Figure 1A:
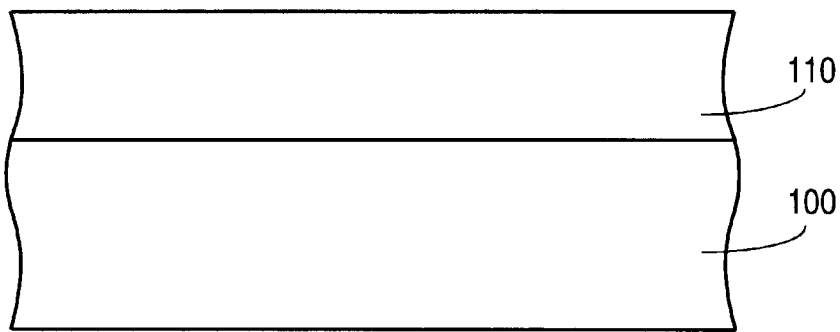
FIGS. 1a–1i illustrate the use of the present invention in a subtractive metal process for forming metal interconnect structures.
Figure 1B:
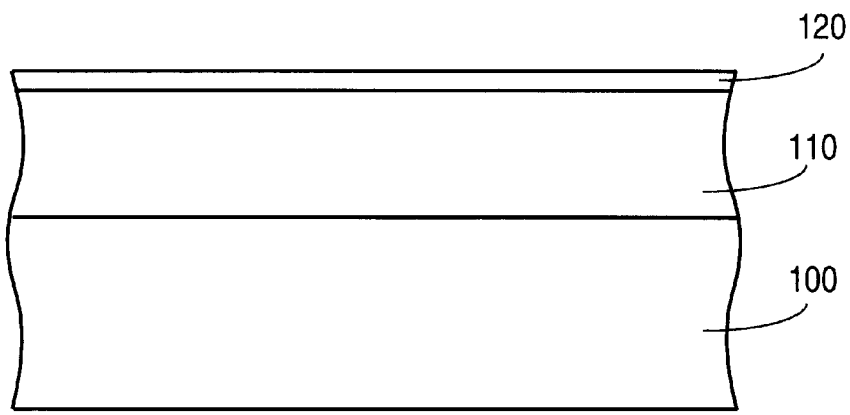

FIGS. 1a–1i illustrate the use of the present invention in a subtractive metal process for forming metal interconnect structures. FIG. 1a illustrates a substrate 100 having a low k material 110 deposited thereon. Low k material 110 is being used as an interlayer dielectric (ILD) to insulate (or isolate) future processing layers from the underlying layers of substrate 100. In this example the next processing layer would be a metal layer. However, because a low k material 110 has been used as the ILD, the present invention deposits a fluorine barrier/liner layer 120 as illustrated in FIG. 1b.

Fluorine barrier/liner layer (barrier layer) 120 may be an amorphous hydrogenated carbon nitride film ($\alpha$-C:N:H) or an amorphous carbon nitride film ($\alpha$-C:N$_x$, wherein x is a variable defining the amount of nitrogen contained in the composition). Barrier layer 120 will decrease the amount of fluorine outdiffusion from low k material 110 into other layers above it during future processing steps. Thus, when processing temperatures increase barrier layer 120 will act as a barrier against fluorine diffusion from the low k material and thereby will decrease the potential for corrosion of the metal layers. $\alpha$-C:N:H or $\alpha$-C:N$_x$ films may be deposited using reactive sputtering or chemical vapor deposition (CVD) techniques (either the conventional CVD or the high density plasma CVD approach).

It should be noted that silicon nitride may also be used as a fluorine barrier layer however, it has a higher dielectric constant, approximately k=4, and if would be more advantageous to use a material as the barrier layer which will have a dielectric constant comparable to that of the low k material being used. It should also be noted that $\alpha$-C:N:H and $\alpha$-C:N$_x$ films may have varying dielectric constants depending upon their microstructure. Therefore, it is desirable to use the $\alpha$-C:N:H and $\alpha$-C:N$_x$ films in their phase states that exhibit low dielectric constants and have good insulative properties. Additionally, it should be noted that it has been found that many materials containing nitrogen act as good fluorine diffusion barriers such that other analogous homologs to the family of nitrides may be used, however, caution should be used because uses of other materials may cause other problems during semiconductor processing.

Figure 1C:
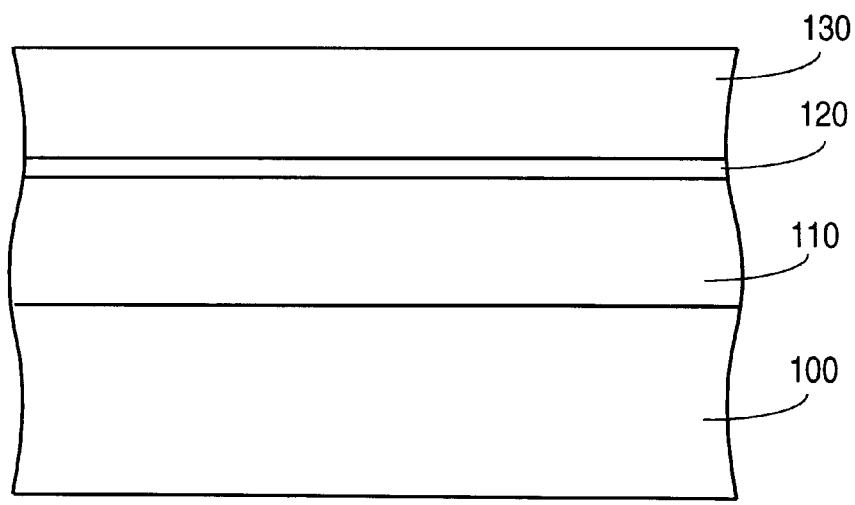
Figure 1D:
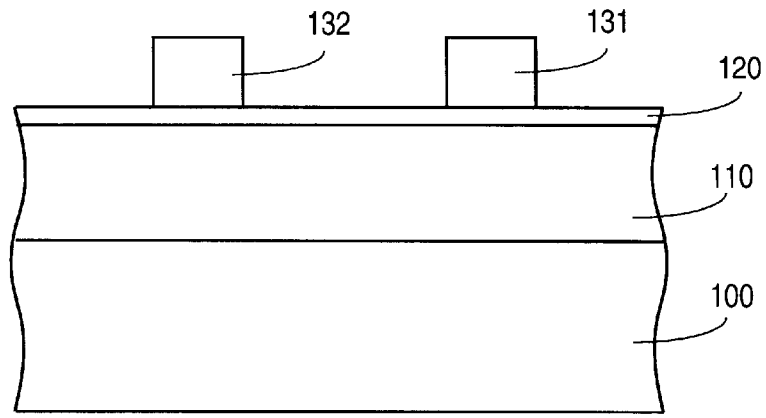
Figure 1E:
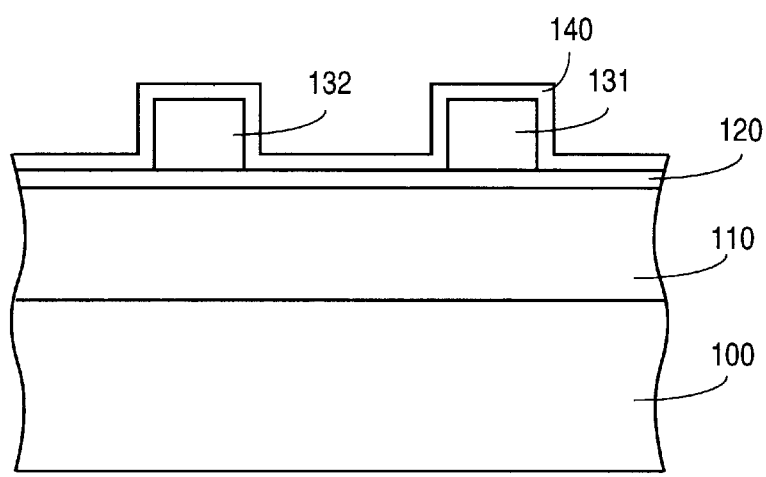
Figure 1F:
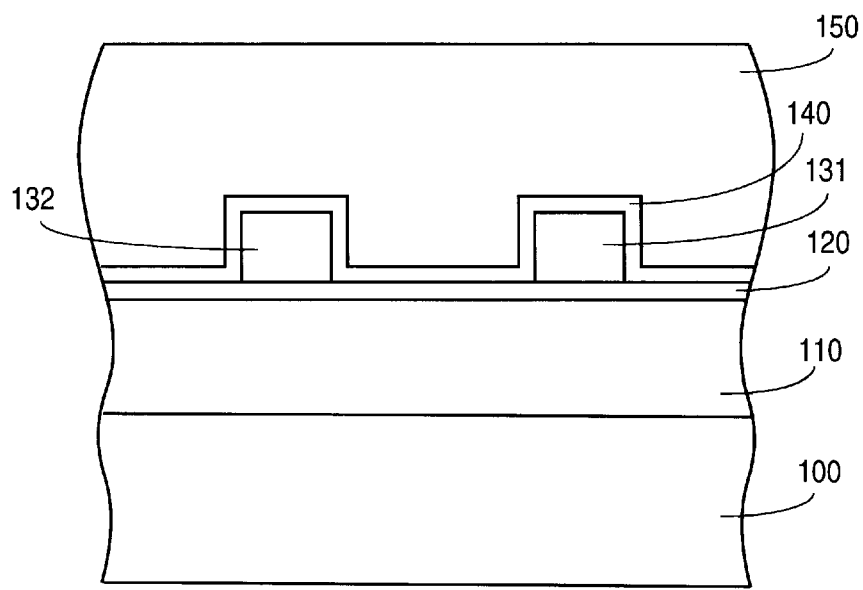

FIG. 1c illustrates the structure of FIG. 1b after a metal layer 130 has been deposited thereon. Metal layer 130 is then patterned using well know patterning techniques into metal lines 131 and 132, as illustrated in FIG. 1d. Metal lines 131 and 132 are protected from fluorine outdiffusion of low k material 110 by barrier layer 120. After metal lines 131 and 132 are formed it may be desirable to insulate the metal lines 131 and 132 from future layers using another low k material. Thus, to protect metal lines 131 and 132 from fluorine outdiffusion from a low k material deposited above them, another barrier layer should be used. FIG. 1e illustrates metal lines 131 and 132 after another barrier layer 140 has been deposited. It should be noted that barrier layer 140 may be the same material as barrier layer 120 or may be one of the other materials that exhibit good fluorine outdiffusion barrier qualities. FIG. 1f illustrates the structure of FIG. 1e after a low k material 150 has been deposited above barrier layer 140.

Figure 1G:
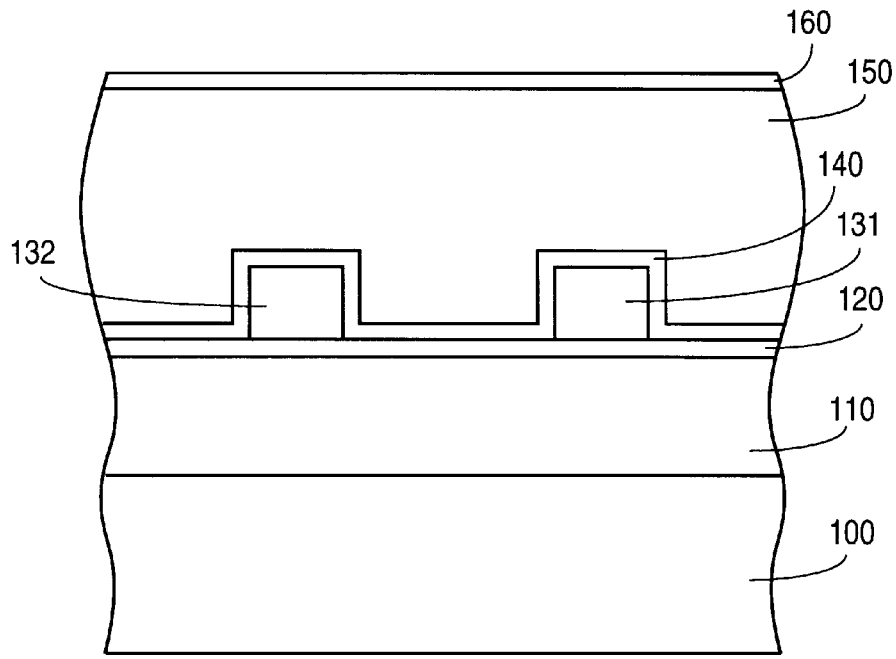

After additional processing layers are formed above metal lines 131 and 132 it may be desirous to form vias and plugs in order to connect metal lines 131 and 132 to other layers. Thus via patterning and etching is performed. In order to continue to protect future processing layers from fluorine outdiffusion of low k material 150 it may be advantageous to add another fluorine barrier layer. FIG. 1g illustrates the structure of FIG. 1f after a fluorine barrier layer 160 has been deposited.

Figure 1H:
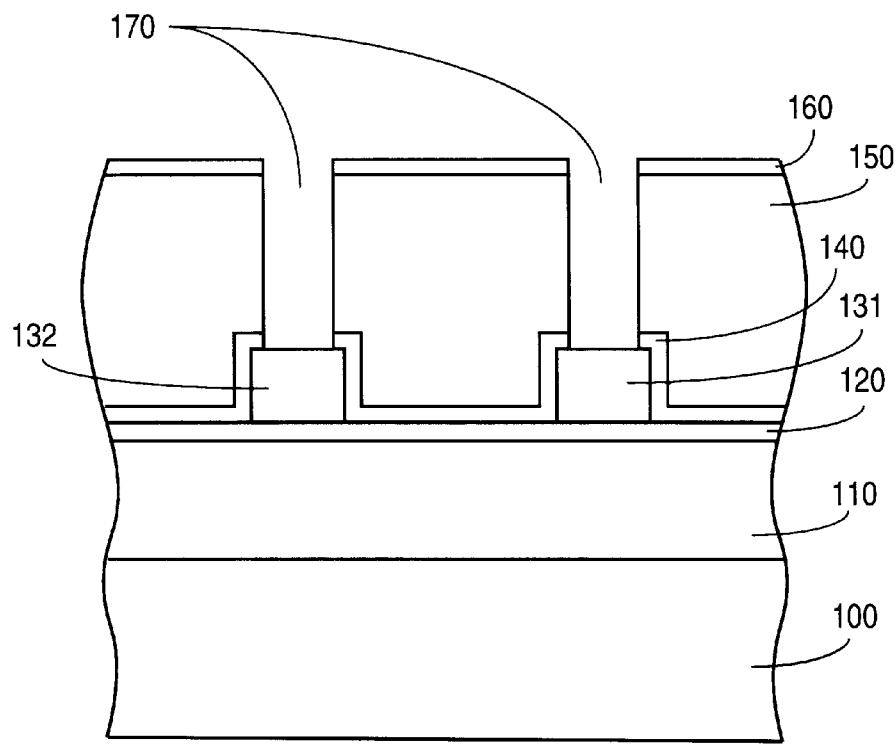
Figure 1I:
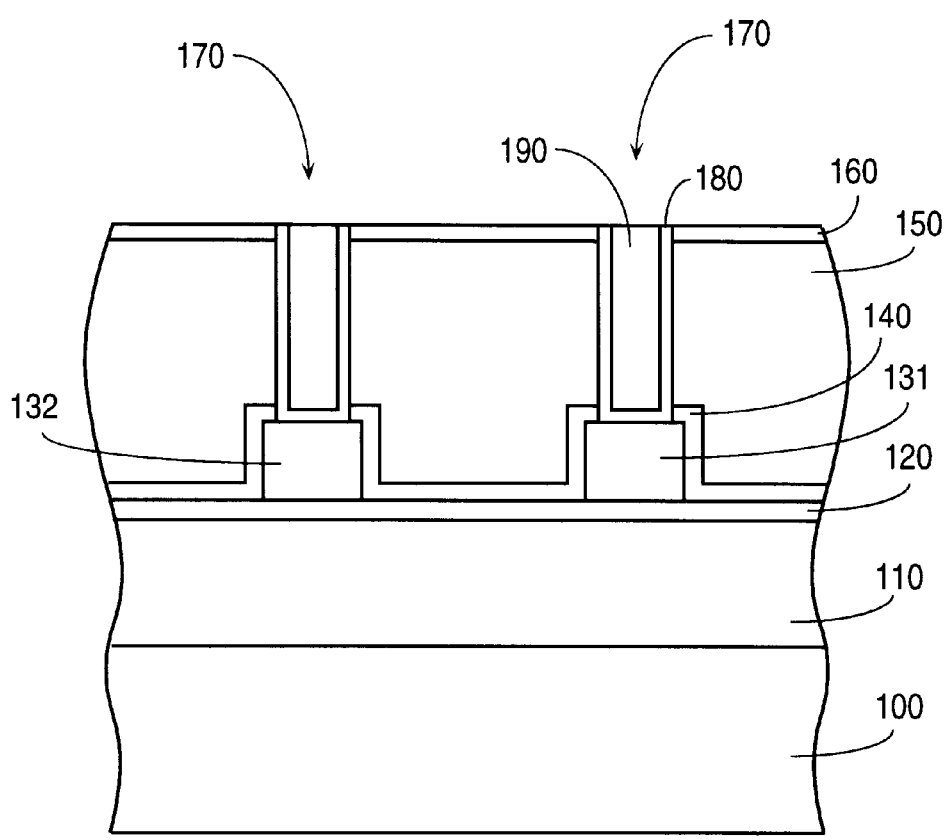

FIG. 1h illustrates the structure of FIG. 1g after vias 170 have been patterned and etched. As illustrated fluorine barrier layer 160 was also etched and the sidewalls of the via 170 are exposed low k material. An additional fluorine barrier layer may be deposited coating the sidewalls and bottom of vias 170, then an argon plasma or other sputtering process may be performed to remove the fluorine barrier from the bottom of the via in order to re-expose metal lines 131 and 132 (not shown). However, these processing steps may not be necessary depending upon the wetting/barrier layer used to fabricate the via. In other words, if a material that resists fluorine outdiffusion but still remains conductive is used then the additional fluorine outdiffusion barrier layer to line the sidewalls is not necessary. For example, as illustrated in FIG. 1i, in tungsten (W) plug technology a wetting/barrier layer 180 such as tantalum nitride or titanium nitride may be used to line vias 170 since both tantalum nitride and titanium nitride exhibit fluorine outdiffusion barrier qualities while remaining conductive. After wetting/barrier layer 180 is deposited then vias 170 are filled with a metal such as tungsten thereby forming the remainder of plug 190, as is also illustrated in FIG. 1i.

FIGS. 1a–1i illustrate just a few ways in which the fluorine barrier layer of the present invention may be used in a subtractive metal process for forming metal interconnect structures. There are many ways and many other device layers in which the fluorine barrier layer of the present invention may be used. The fluorine barrier layer of the present invention may also be used in the damascene process for forming metal interconnect lines.

FIGS. 2a–2f illustrate the present invention as used in a damascene process for forming metal interconnect structures. It should be noted that some of the steps and techniques of the damascene process are similar to the steps above and are therefore not discussed in detail again.

Figure 2A:
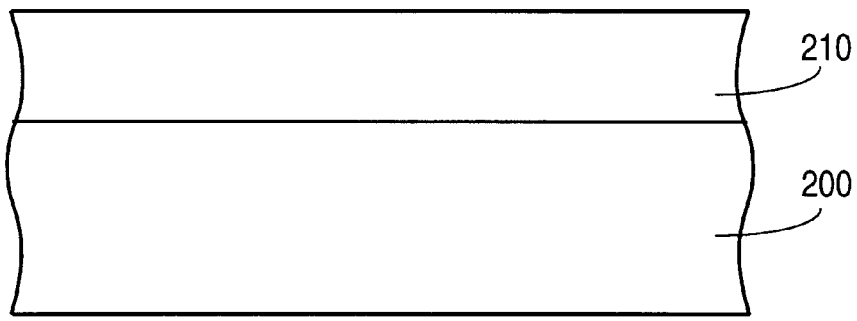
FIGS. 2a–2f illustrate the present invention as used in a damascene process for forming metal interconnect structures.
Figure 2B:
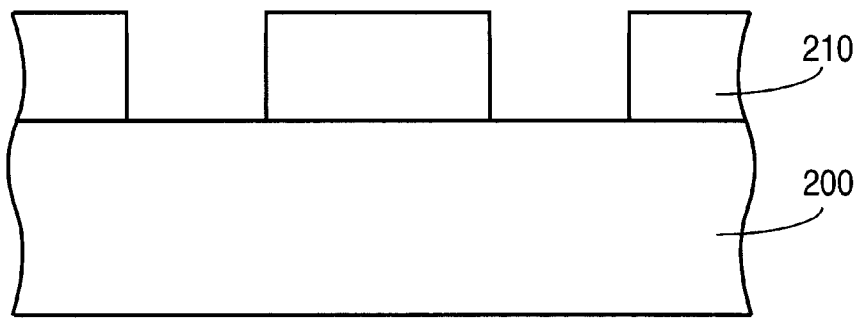
Figure 2C:
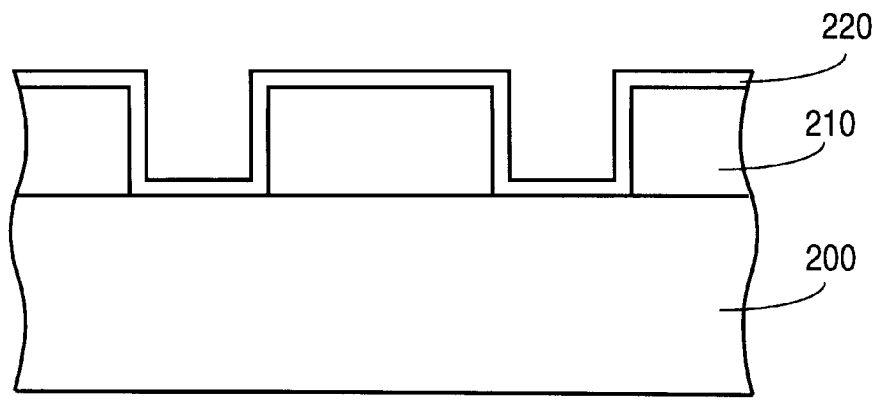

FIG. 2a illustrates a substrate 200 having a low k material 210 deposited thereon. Since the damascene process is being performed the low k material 210 is being used as an intermetal dielectric (IMD) to insulate (or isolate) the metal lines to be patterned therein. In this example the low k material 210 is patterned and etched using well known processing techniques as illustrated in FIG. 2b. Next in order to protect the metal lines that will be formed in the holes etched into low k material 210, the present invention deposits a fluorine barrier/liner layer 220 as illustrated in FIG. 2c. Fluorine barrier/liner layer (barrier layer) 220 may be made up of the same materials as discussed above in FIGS. 1a–1i. It should be noted that if the metal lines are to contact with an underlying device or layer (not shown), an argon plasma or other sputtering process may be performed to remove the fluorine barrier from the bottom of the contact/via in order for good ohmic contact.

Figure 2D:
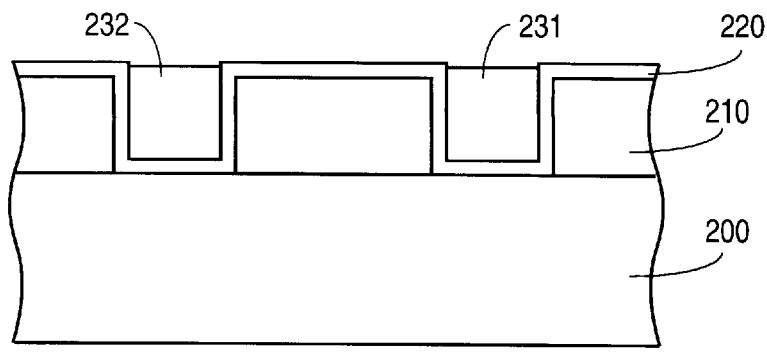
Figure 2E:
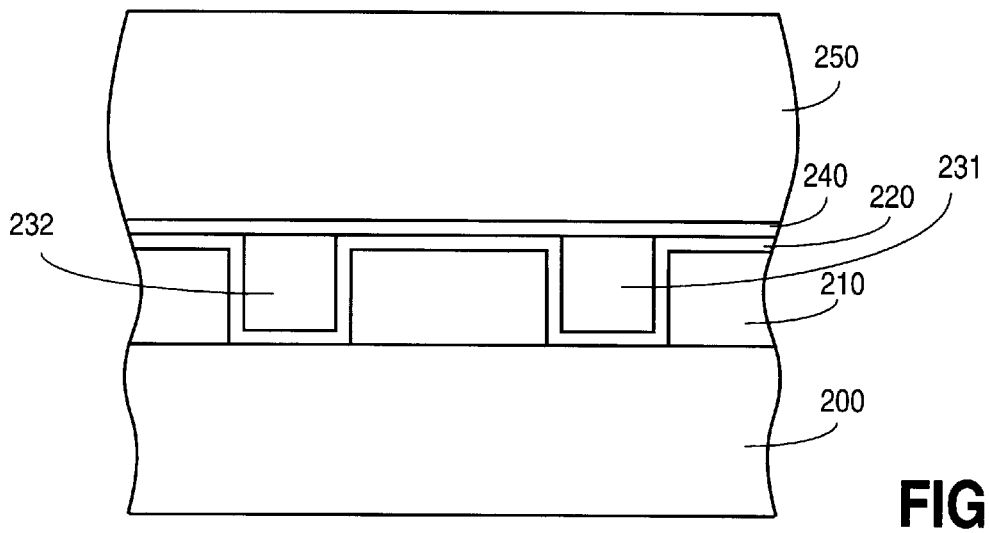

FIG. 2d illustrates the structure of FIG. 2c after a metal lines 231 and 232 have been formed in the holes of low k material 210. It should be noted that metal deposition techniques for damascene processing are well known in the art and are therefore not discussed in detail herein. Metal lines 231 and 232 are protected from fluorine outdiffusion of low k material 210 by fluorine barrier layer 220. After metal lines 231 and 232 are formed it may be desirable to insulate the metal lines 231 and 232 from future layers using another low k material. Thus, to protect metal lines 231 and 232 from fluorine outdiffusion from a low k material deposited above them, another barrier layer should be used. FIG. 2e illustrates metal lines 231 and 232 after another fluorine barrier layer 240 and low k material 250 have been deposited. It should be noted that fluorine barrier layer 240 may be the same material as fluorine barrier layer 220 or may be one of the other materials that exhibit good fluorine outdiffusion barrier qualities.

After additional processing layers are formed above metal lines 231 and 232 it may be desirous to form vias and plugs in order to connect metal lines 231 and 232 to other layers. Thus via patterning and etching as discussed above with regard to FIGS. 1g–1i is performed. Because the processing steps for via and plug formation is similar to that discussed above with respect to the subtractive metal process for forming metal interconnect structures the details are not discussed herein.

Figure 2F:
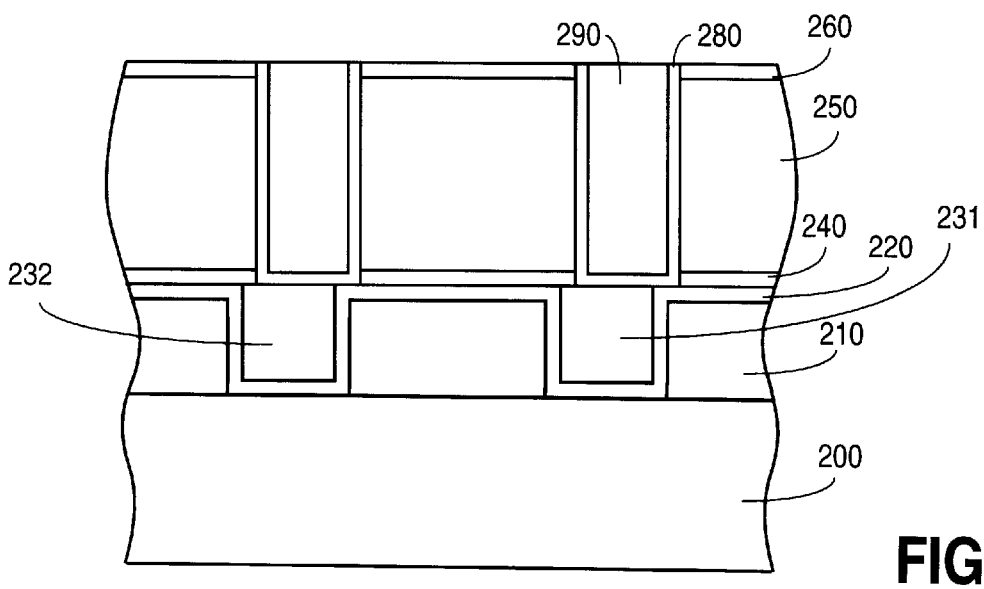

FIG. 2f illustrates the structure of FIG. 2e after vias and plugs 290 have been formed to contact underlying metal lines 231 and 232. An additional fluorine barrier layer 260 was deposited above low k material 250. Vias (not shown) were patterned and etched through fluorine barrier layer 260, low k material 250, and fluorine barrier layer 240 in order to expose underlying metal lines 231 and 232. Finally, the vias were filled using wetting/barrier layer 280 (such as tantalum nitride or titanium nitride for reasons discussed above) and the remainder of the vias are filled with a metal (such as tungsten) thereby forming the remainder of plug 290, as is illustrated in FIG. 2f.

It should be noted that fluorine barrier layers may also be used as a hardmask cap to protect the ILD during etching and patterning of processing layers above the ILD. It should also be noted that it is not necessary to use every fluorine barrier described above. A particular manufacturer may place barrier layers in areas where it is of particular importance to protect the metal layers from fluorine outdiffusion. Additionally, it should be noted that not all device layers are necessarily separated (or isolated) using low k materials and that other ILD materials may be used.

Thus, a Unique $\alpha$-C:N:H/$\alpha$-C:N$_x$ Film Liner/Barrier for $\alpha$-FC Chemical Vapor Deposition Dielectric Layers for Advanced Interconnects has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for decreasing fluorine outdiffusion comprising:

depositing a fluorine barrier layer, wherein said fluorine barrier layer is deposited between a metal layer and a low k material and wherein said fluorine barrier layer is selected from the group consisting of: amorphous hydrogenated carbon nitride and amorphous carbon nitride.

2. The method as described in claim 1 wherein said fluorine barrier layer is deposited using reactive sputtering.

3. The method as described in claim 1 wherein said fluorine barrier layer is deposited using chemical vapor deposition techniques.

4. A method for decreasing fluorine outdiffusion comprising:

depositing a metal layer;

patterning said metal layer;

depositing a fluorine barrier layer, wherein said fluorine barrier layer is selected from the group consisting of: amorphous hydrogenated carbon nitride and amorphous carbon nitride; and depositing a low k material.

5. The method as described in claim 4 wherein said fluorine barrier layer is deposited using reactive sputtering.

6. The method as described in claim 4 wherein said fluorine barrier layer is deposited using chemical vapor deposition techniques.

7. A method for decreasing fluorine outdiffusion comprising:

depositing a low k material;

depositing a fluorine barrier layer, wherein said fluorine barrier layer is selected from the group consisting of: amorphous hydrogenated carbon nitride and amorphous carbon nitride; and depositing a metal layer.

8. The method as described in claim 7 wherein said fluorine barrier layer is deposited using reactive sputtering.

9. The method as described in claim 7 wherein said fluorine barrier layer is deposited using chemical vapor deposition techniques.

10. A method for decreasing fluorine outdiffusion comprising:

depositing a low k material;

etching said low k material;

depositing a fluorine barrier layer, wherein said fluorine barrier layer is selected from the group consisting of: amorphous hydrogenated carbon nitride and amorphous carbon nitride; and depositing a metal layer.

11. The method as described in claim 10 wherein said fluorine barrier layer is deposited using reactive sputtering.

12. The method as described in claim 10 wherein said fluorine barrier layer is deposited using chemical vapor deposition techniques.

* * * * *